US007339662B2

(12) United States Patent
Takeishi (10) Patent No.: US 7,339,662 B2
(45) Date of Patent: *Mar. 4, 2008

(54) EXPOSURE APPARATUS AND A DEVICE MANUFACTURING METHOD USING THE SAME

(75) Inventor: Hiroaki Takeishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/114,158

(22) Filed: Apr. 26, 2005

(65) Prior Publication Data

US 2005/0185164 A1  Aug. 25, 2005

Related U.S. Application Data

(60) Division of application No. 10/207,768, filed on Jul. 31, 2002, now Pat. No. 6,897,949, which is a continuation of application No. 09/418,253, filed on Oct. 15, 1999, now Pat. No. 6,456,374.

(30) Foreign Application Priority Data

Oct. 19, 1998 (JP) ................................. 10-313957

(51) Int. Cl.
  *G01N 21/00* (2006.01)
(52) U.S. Cl. ................. 356/237.3; 356/394; 356/237.1
(58) Field of Classification Search .. 356/237.1–237.6, 356/392–394, 401; 350/559.4, 559.28, 559.31, 350/548, 201.4; 355/30, 50, 53, 67, 75
See application file for complete search history.

(56) References Cited

U.S. PATENT DOCUMENTS

| | | | |
|---|---|---|---|
| 4,849,901 A | 7/1989 | Shimizu | 364/468 |
| 4,893,932 A | 1/1990 | Knollenberg | 356/369 |
| 5,105,075 A | 4/1992 | Ohta et al. | 250/201.2 |
| 5,124,562 A * | 6/1992 | Kawashima et al. | 250/548 |
| 5,142,156 A * | 8/1992 | Ozawa et al. | 250/548 |
| 5,162,867 A | 11/1992 | Kohno | 356/237.5 |
| 5,218,415 A | 6/1993 | Kawashima | 356/152 |
| 5,243,377 A | 9/1993 | Umatate et al. | 355/53 |
| 5,363,172 A | 11/1994 | Tokuda | 355/71 |
| 5,448,332 A | 9/1995 | Sakakibara et al. | 355/53 |
| 5,473,424 A * | 12/1995 | Okumura | 356/139.03 |
| 5,559,582 A * | 9/1996 | Nishi et al. | 355/30 |
| 5,569,930 A | 10/1996 | Imai | 260/559.4 |

(Continued)

FOREIGN PATENT DOCUMENTS

JP    61-287229    12/1986

(Continued)

*Primary Examiner*—Sang H. Nguyen
(74) *Attorney, Agent, or Firm*—Fitzpatrick, Cella, Harper & Scinto (57) ABSTRACT

A scanning type exposure apparatus includes a projection optical system which projects a pattern of a reticle onto a wafer, which is held by a wafer chuck, a scanning stage system which scanningly moves the reticle and the wafer synchronously with respect the projection optical system, and an inspection system which automatically inspects influence of particles on at least one of the wafer and on the wafer chuck. The inspection system includes a focus detector which measures a focus state of the wafer and a calculator which calculates outputs of the focus detector.

10 Claims, 5 Drawing Sheets

U.S. PATENT DOCUMENTS

| | | | |
|---|---|---|---|
| 5,585,918 A | 12/1996 | Takeuchi et al. | 356/237 |
| 5,587,794 A | 12/1996 | Mizutani et al. | 356/375 |
| 5,602,400 A * | 2/1997 | Kawashima | 250/548 |
| 5,602,639 A * | 2/1997 | Kohno | 356/237.4 |
| 5,657,130 A * | 8/1997 | Shirasu et al. | 356/401 |
| 5,729,337 A * | 3/1998 | Tanaka | 356/139.1 |
| 5,737,063 A | 4/1998 | Miyachi | 355/53 |
| 5,747,202 A | 5/1998 | Tanaka | 430/30 |
| 5,751,428 A * | 5/1998 | Kataoka et al. | 356/401 |
| 5,777,744 A | 7/1998 | Yoshii et al. | 356/372 |
| 5,825,043 A | 10/1998 | Suwa | 250/548 |
| 5,825,468 A | 10/1998 | Ishimaru | 355/55 |
| 5,942,357 A | 8/1999 | Ota | 430/22 |
| 5,978,078 A | 11/1999 | Salamati-Saradh et al. | 356/237 |
| 6,080,517 A | 6/2000 | Miyachi | 430/30 |
| 6,117,598 A * | 9/2000 | Imai | 430/22 |
| 6,118,515 A | 9/2000 | Wakamoto et al. | 355/53 |
| 6,163,369 A | 12/2000 | Yamada et al. | 355/55 |
| 6,277,533 B1 | 8/2001 | Wakamoto et al. | 430/30 |
| 6,287,734 B2 | 9/2001 | Imai | 430/22 |
| 6,411,387 B1 | 6/2002 | Kaneko et al. | 356/401 |
| 6,456,374 B1 * | 9/2002 | Takeishi | 356/237.3 |
| 6,894,763 B2 * | 5/2005 | Murakami et al. | 355/53 |

FOREIGN PATENT DOCUMENTS

| | | | |
|---|---|---|---|
| JP | 63006511 A * | 1/1988 | |
| JP | 1-264220 | 10/1989 | |
| JP | 2-122613 | 5/1990 | |
| JP | 7-37772 | 2/1995 | |
| JP | 8-37150 | 2/1996 | |
| JP | 9-266169 | 10/1997 | |

* cited by examiner

EXPOSURE APPARATUS AND A DEVICE MANUFACTURING METHOD USING THE SAME

This application is a divisional application of copending patent application Ser. No. 10/207,768, filed on Jul. 31, 2002, which is a continuation of patent application Ser. No. 09/418,253, filed on Oct. 15, 1999, which issued as U.S. Pat. No. 6,456,374 on Sep. 24, 2002.

BACKGROUND OF THE INVENTION

1. Field of the Invention

The present invention relates to a scanning type exposure apparatus and method, and a device manufacturing method, wherein the exposure apparatus is preferably used in a lithography process for manufacturing micro-devices.

2. Description of the Related Art

In a lithography process of micro-device (semiconductor) manufacturing, two types of exposure apparatuses are known. One is a step-and-repeat type (so-called a stepper) and the other is a step-and-scan type (so-called a scanner or a scanning type exposure apparatus).

The former type uses a step-and-repeat sequence for transferring stepwise a pattern of an original (e.g., a reticle or a mask) onto a substrate (e.g., a semiconductor wafer or a glass substrate). In that sequence, the whole pattern of the original is illuminated and is projected onto one of a plurality of exposure regions of the substrate through a projection optical system, while the original and the substrate are maintained stationary. Next, the substrate is moved stepwise to change the exposure region and then exposure is repeated in the same manner.

On the other hand, the latter type uses a step-and-scan sequence. In that sequence, the original pattern is illuminated with a slit-like beam and a portion of the pattern is projected onto one of the exposure regions of the substrate, while both the original and the substrate are scanningly moved. Then, the substrate is moved stepwise to change the exposure region, and thereafter the exposure is repeated in the same manner.

The latter step-and-scan type exposure apparatus seems to have become the mainstream, expected at least in the near future, for the reason that it has a high potential of exposure performance in terms of an increase in transferring precision and field size.

The scanning type exposure apparatus mainly comprises stage devices (e.g., a wafer stage or a reticle stage) for scanningly moving the wafer and the reticle (mask), an illumination optical system and a projection optical system. In this apparatus, while scanning exposure is performed, the wafer stage and the reticle stage are synchronously controlled by a master-slave control method, in which the wafer stage is a master stage and the reticle stage is a slave stage, and the reticle stage follows the movement of the wafer stage in the scanning direction. The master-slave control method provides an advantage in improving movement resolution, especially when the projection optical system is a reduced scale system.

The apparatus also includes detection systems, e.g., laser interferometers for detecting the stage positions in the scanning direction, and a focus detector for detecting a distance between the wafer surface and a focal plane of a projection optical system during the scanning exposure, for adjusting the wafer surface with respect to a focal plane of the projection optical system.

Time series outputs from the focus detector tend to have smooth variations. With the recent advancements in wafer planarization processes and to increase pattern transfer accuracy, wafers are processed to be as smooth as possible. As a result, the focus detection outputs typically do not have sudden variations, at least within each chip area (shot area).

Conversely, adjusting the wafer surface in the tilt direction according to a detection having sudden variations causes defocusing within the chip area. For example, if a 50 ppm inclination was obtained as the focus detection on a condition that the chip area has a 20 mm size in a longitudinal slit direction, there exists 50 ppm×20 mm=1 micron of height difference in a Z direction between edge portions of the chip area. Since the recent exposure apparatuses have a DOF (Depth Of Focus) of at most 0.7 micron, it is difficult to perform exposure without causing any defocusing in each of the chip areas.

One of the expected causes of sudden focus detection variations is the presence of contaminated particles on the wafer or the wafer chuck surface. For example, wafer resist exfoliation particles are apt to cling onto the wafer surface or the chuck surface in the form of such contaminated particles. Semiconductor manufacturing processes pay close attention to reduce such resist exfoliation particles, and regular maintenance checks are performed to replace and clean the wafer chuck. However, the contaminated particles on the chuck are frequently not detected. Therefore, the chuck may become contaminated during the term between the maintenance checks. Consequently, productivity (e.g., chip production yield) deteriorates.

SUMMARY OF THE INVENTION

It is an object of the invention to provide an improved exposure apparatus and a semiconductor manufacturing method having high reliability and productivity.

According to one aspect of the present invention, a scanning type exposure apparatus comprises a projection optical system which projects a pattern of a reticle onto a wafer, which is held by a wafer chuck, a scanning stage system which scanningly moves the reticle and the wafer synchronously with respect the projection optical system, and an inspection system which automatically inspects influence of particles on at least one of the wafer and on the wafer chuck.

According to another aspect of the present invention, an inspection method for a scanning type exposure apparatus comprises the steps of holding a wafer on a chuck of a wafer stage, scanningly moving, by the wafer stage, the held wafer relative to a focus detector, detecting, by the focus detector, a focus state of the wafer a plurality of times in a row while scanning is performed, and producing a plurality of detection data, and comparing the plurality of detection data to a threshold, in order to determine sudden changes of the plurality of data.

According to yet another aspect of the present invention, a device manufacturing method for manufacturing microdevices comprises the steps of holding a wafer on a chuck of a wafer stage, holding a reticle having a pattern on a reticle stage, scanningly moving the reticle and the wafer synchronously with respect a projection optical system and a focus detector, so as to transfer the pattern onto the wafer, detecting, by the focus detector, a focus state of the wafer a plurality of times in a row while scanning is performed, and producing a plurality of detection data, and comparing the plurality of detection data to a threshold in order to determine sudden changes of the plurality of data.

These and other objects, features and advantages of the present invention will become more apparent from the following description of the preferred embodiments taken in conjunction with the accompanying drawings.

DESCRIPTION OF THE PREFERRED EMBODIMENTS

The invention will be described in further detail by way of example with reference to the accompanying drawings.

Figure 1:
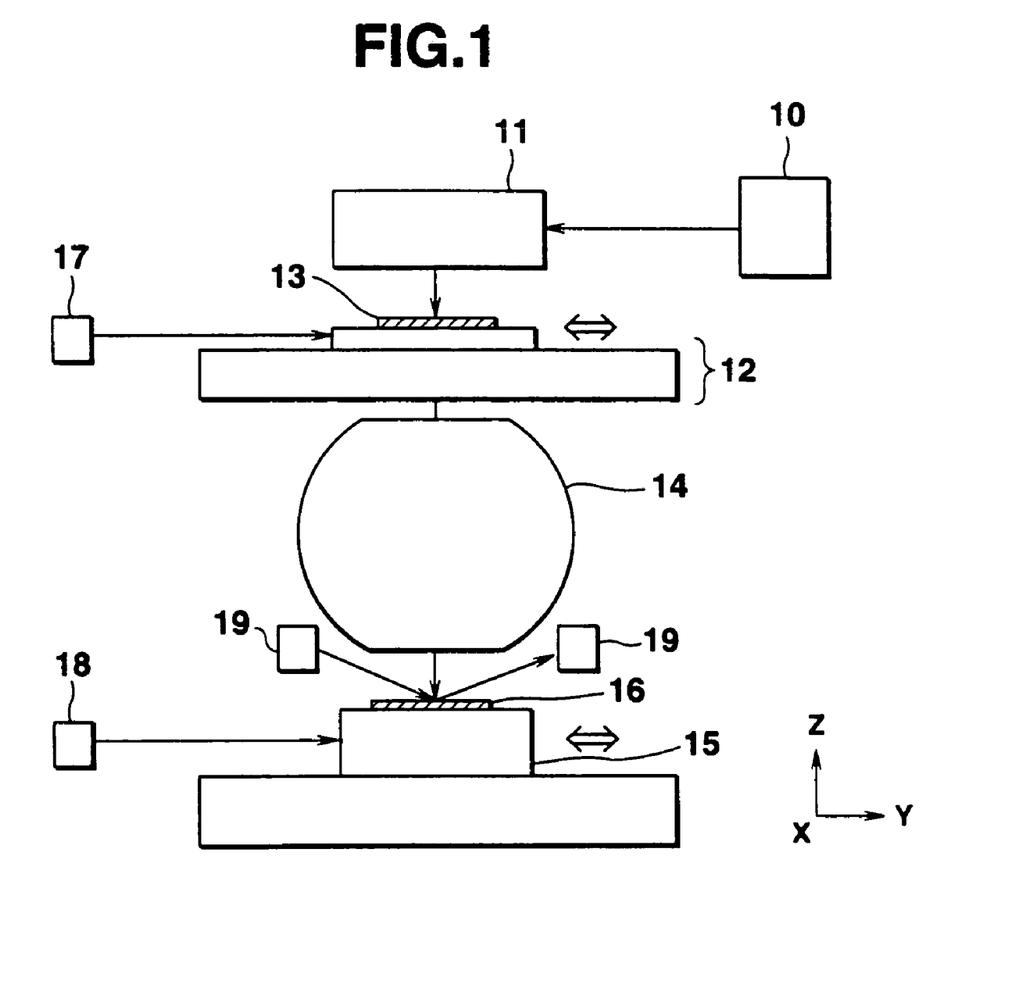
FIG. 1 is a schematic view of a scanning type exposure apparatus according to the invention.

FIG. 1 schematically illustrates a scanning type exposure apparatus for manufacturing semiconductors according to an embodiment of the present invention. Referring to FIG. 1, the apparatus/comprises a light source 10, such as an excimer laser (e.g., KrF, ArF or $F_2$), an illumination optical system 11, a reticle stage 12, which holds and moves a reticle 13 having a device pattern, a projection optical system 14, and a wafer stage 15, which holds and moves a wafer 16 to be exposed. The illumination optical system 11 reshapes the light beam from the light source 10 to form a slit beam having a width of several millimeters. The slit beam illuminates the reticle 13 held by the reticle stage 12. The projection optical system 14 projects a portion of the reticle pattern onto the wafer 16 at a desired reduction magnification, e.g., 4:1 or 5:1.

The apparatus further comprises laser interferometers 17, 18, which respectively measure the position of the reticle stage 12 and the wafer stage 15 in the scanning direction (Y-direction), and a focus detector 19, which detects a distance (Z-direction) and an inclination (tilt-directions) between the wafer surface and a focal plane of the projection optical system 14. The focus detector 19 comprises an oblique incidence detection system, having a light source and a photodetector, which illuminates the wafer 16 with an oblique light beam by the light source and detects a focusing state or a position of the reflected light by the photodetector. In another embodiment, the focus detector may include a fluid micrometer system, which applies a pressurized gas toward the wafer and detects a back pressure of the gas.

While scanning exposure is performed, movement of the reticle stage 12 and the wafer stage 15 is synchronously controlled using a master-slave control method, based on the measurements of the interferometers 17, 18. Thereby, a larger exposure field can be obtained. Also, the focus in the Z-direction and the leveling in the tilt-directions of the wafer stage can be controlled based on the measurement of the focus detector 19.

Figure 2:
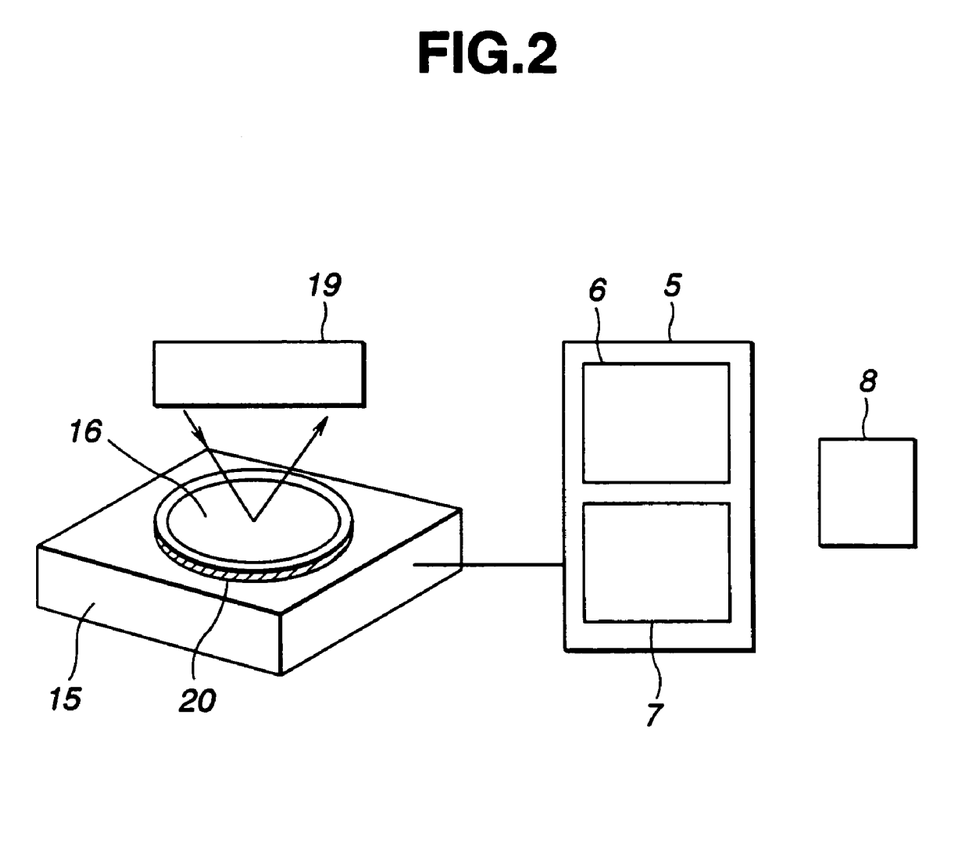
FIG. 2 is a schematic view of a system for detecting particles in the exposure apparatus of FIG. 1.

FIG. 2 illustrates a schematic view of a system for detecting particles in the above-mentioned exposure apparatus. Referring to FIG. 2, the wafer stage 15, including a wafer chuck 20, which attracts and holds the wafer 16, can move and position the wafer 16 with six degrees of freedom. The focus detector 19 measures a distance between the focal plane of the projection optical system 14 and the upper surface of the wafer 16. A controller 5, for controlling operations of the exposure apparatus, includes a stage controller 6 and a calculator 7. The calculator 7 stores a computer program for automatically inspecting the influence of particles on at least one of the wafer and the chuck (i.e., between the wafer chuck surface and the opposite side of the wafer). An operational console 8 is a user interface for the operator.

Figures 3A, 3B:
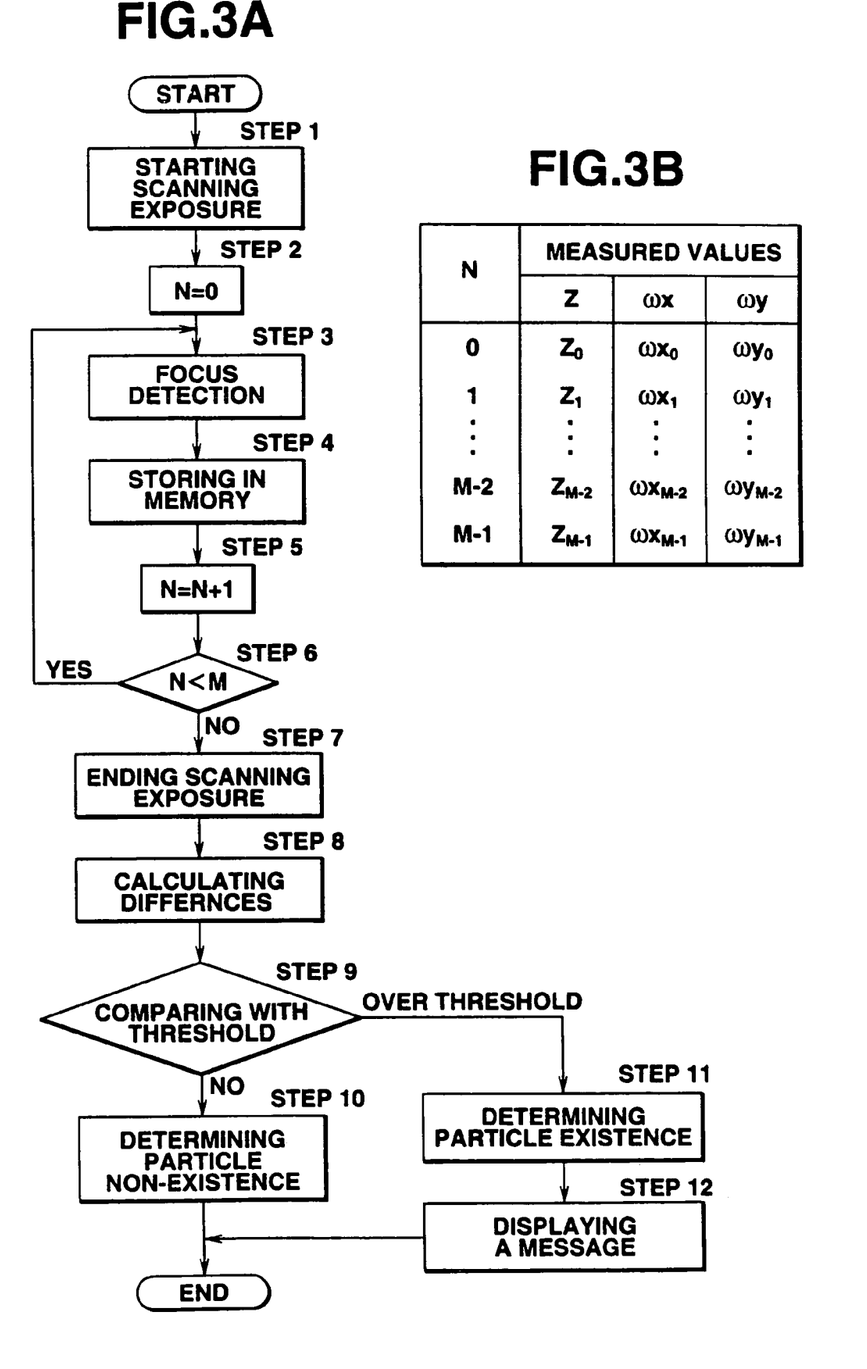
FIG. 3A is a flowchart of a method for inspecting particles in each chip area and FIG. 3B shows information stored in a memory storing step of the FIG. 3A flowchart.

FIG. 3 is a flowchart for explaining a method of determining particles within each chip area processed by the controller 5. Following an initial start-up step, the method includes the following steps. Step 1 includes starting a scanning exposure operation in one chip area according to the order of the controller 5. Step 2 includes initialization, N=0. Step 3 includes performing a first time focus detection. Step 4 includes storing measured data in perpendicular directions, Z, Wx and Wy, in a memory. Measurement positions in the chip area have been previously set in the controller 5. In step 5, N is incremented by one to N=N+1. In step 6, the detection returns to step 3, M (>1) times, while scanning is performed, for M>N. The plurality of detection data obtained in a row are stored in a matrix in the memory, as shown in FIG. 3B. Scanning exposure is completed in step 7.

In step 8, after the scanning exposure is finished, the calculator 7 calculates differences between measured values of an N(1~M−1)th detection and an (N+1)th detection. In step 9, a calculated difference is compared with a threshold. In step 10, if no calculated difference exceeds a threshold (predetermined value), then operation proceeds to the end. However, if any calculated difference exceeds a threshold, that means a sudden change of values has occurred and it is determined in step 11 that at least one particle could exist on or near the measured position on the wafer 16 or on the holding surface of the wafer chuck 20.

In step 12, the operational console 8 displays a message or sounds a warning signal to indicate to the operator that a potential particle exists, based on the calculation. Therefore, it is possible to abort an exposure operation based on an instruction of the operator, or automatically, in order to clean the wafer chuck 16 for removing the particles. Hence, it is easy to reduce defective chips and to increase manufacturing productivity.

Meanwhile, although the above example shows a method of performing the focus detection during the pattern transfer for detecting particles, another solution could be provided. That is, the apparatus can have a special inspection mode to detect particles without performing pattern transfer, namely, by performing the focus detection while moving the wafer stages without illuminating the reticle and the wafer with exposure light.

Further, it may be desirable to modify the above embodiment into determining particles for every wafer (including a plurality of chip areas), instead of for each chip area. That would be achieved by memorizing the measured data of all chip areas of the wafer and performing calculations for every wafer at the time of wafer replacement. Also, it is possible to analyze historical data for each wafer, for example, by comparing the Nth and the (N+1)th wafer.

Figure 4:
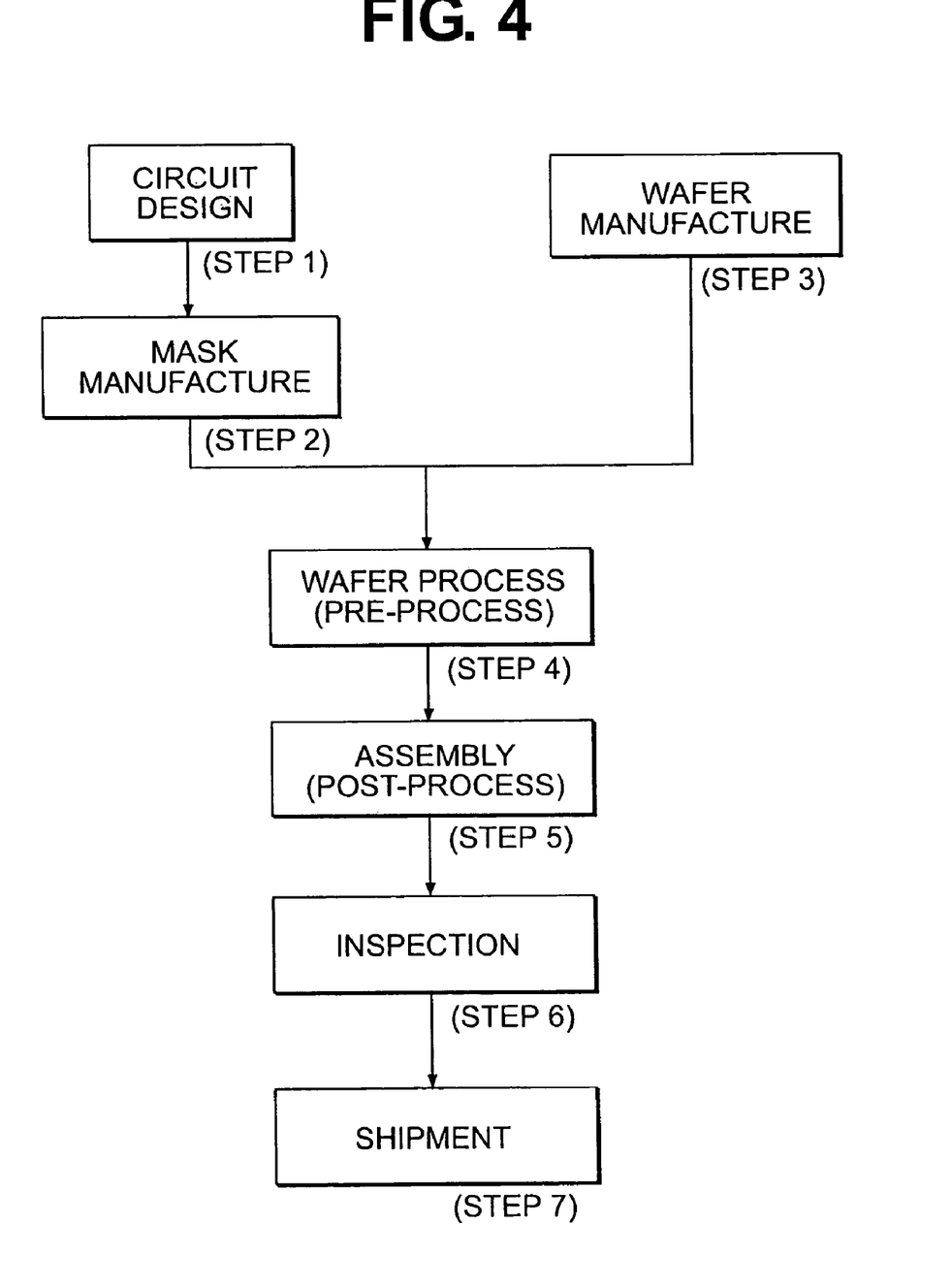
FIG. 4 is a flowchart showing a process for manufacturing a micro-device.

FIG. 4 is a flowchart showing a process for manufacturing a micro-device (e.g., a semiconductor chip such as an IC or an LSI, a liquid crystal panel, a CCD (charge-coupled device), a thin film magnetic head, a micro-machine or the like). At step 1 (circuit design), the circuit design of the semiconductor device is effected. At step 2 (the manufacturing of a mask), a mask (reticle) formed with the designed circuit pattern is manufactured. At step 3 (the manufacturing of a wafer), a wafer is manufactured by the use of a material such as silicon. Step 4 (wafer process) is called a pre-process, in which by the use of the manufactured mask and wafer, an actual circuit is formed on the wafer by lithography techniques. The next step, step 5 (assembling), is called a post-process, which is a process for making the wafer manufactured at step 4 into a semiconductor chip, and includes steps such as an assembling step (dicing and bonding) and a packaging step (enclosing the chip). At step 6 (inspection), inspections such as an operation-confirming test and a durability test of the semiconductor device manufactured at step 5 are carried out. Via such steps, the semiconductor device is completed, and it is delivered (step 7).

Figure 5:
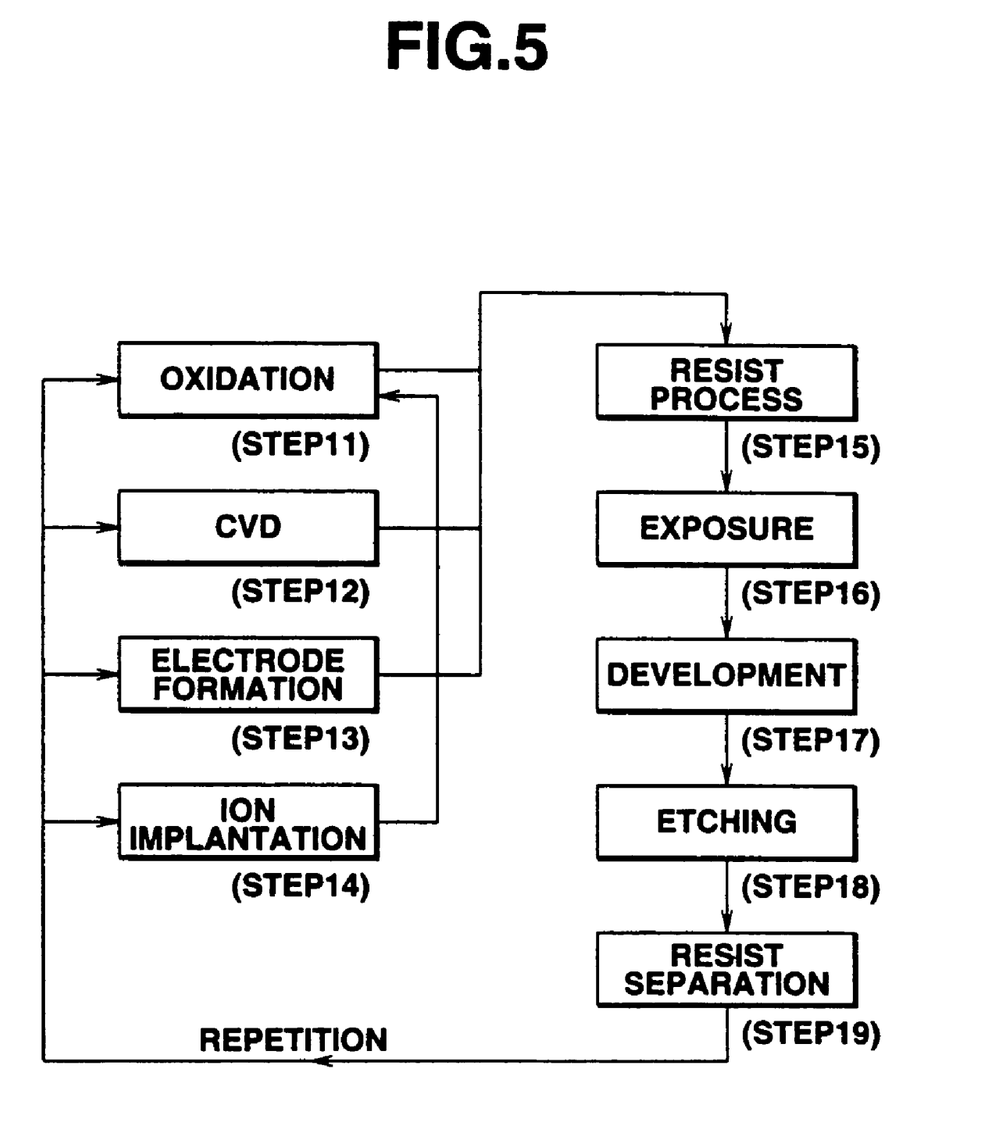
FIG. 5 is a flowchart showing the detailed steps of the wafer process in the micro-device manufacturing process shown in FIG. 4.

FIG. 5 is a flowchart showing the detailed steps of the wafer process discussed above with respect to step 4. At step 11 (oxidation), the surface of the wafer is oxidized. At step 12 (CVD), an insulating film is formed on the surface of the wafer. At step 13 (the forming of an electrode), an electrode is formed on the wafer by vapor deposition. At step 14 (ion implantation), ions are implanted into the wafer. At step 15 (resist processing), a photoresist is applied to the wafer. At step 16 (exposure), the circuit pattern of the mask is printed and exposed onto the wafer by the exposure apparatus. At step 17 (development), the exposed wafer is developed. At step 18 (etching), the portions other than the developed resist image are scraped off. At step 19 (the peeling-off of the resist), the resist, which has become unnecessary after the etching, is removed. By repetitively carrying out these steps, circuit patterns are multiplexly formed on the wafer. If the manufacturing method of the present embodiment is used, it will be possible to manufacture semiconductor devices having a high degree of integration, which have heretofore been difficult to manufacture.

Except as otherwise disclosed herein, the various components shown in outline or in block form in the figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus for performing an exposure of a wafer to light via a mask while the mask and the wafer are scanned, said apparatus comprising:
   a projection optical system configured to project a pattern of the mask onto the wafer;
   a detection system configured to detect a position of a surface of the wafer in a direction of an optical axis of said projection optical system, with respect to each of a plurality of positions on the surface arranged along a direction of a scan of the wafer, while the scan is performed;
   a wafer stage configured to hold the wafer and to be moved based on positions of the surface detected by said detection system, while the exposure is performed; and
   a controller configured to calculate a difference and to compare the difference with a threshold, the difference being a difference between two detected positions of a plurality of detected positions of the surface, the plurality of detected positions of the surface being obtained by said detection system, while the scan is performed, without performing the exposure, the two detected positions being obtained with respect to two successive positions of the plurality of positions on the surface.

2. An exposure apparatus according to claim 1, further comprising a user interface configured to perform an indication concerning a comparison performed by said controller.

3. An exposure apparatus according to claim 1, wherein said controller is configured to abort an operation of said apparatus if the difference exceeds the threshold.

4. An exposure apparatus according to claim 1, wherein said detection system is configured to output information of the position of the surface, the information including information of a tilt amount of the surface.

5. An exposure apparatus according to claim 1, wherein said detection system is configured to detect the position of the surface optically.

6. An exposure apparatus according to claim 1, wherein said detection system includes a fluid micrometer and is configured to detect the position of the surface using said fluid micrometer.

7. An exposure apparatus according to claim 1, wherein said controller is configured to control operation of said detection system and said wafer stage without performing the exposure.

8. An exposure apparatus according to claim 1, wherein said controller is configured to compare the difference with the threshold with respect to each part of the wafer.

9. An exposure apparatus according to claim 1, wherein said controller is configured to compare the difference with the threshold with respect to each of a plurality of the wafers.

10. A method of manufacturing a device using an exposure apparatus for performing an exposure of a wafer to light via a mask and a projection optical system configured to project a pattern of the mask onto the wafer, while the mask and the wafer are scanned, said method comprising steps of:
   detecting a position of a surface of the wafer in a direction of an optical axis of the projection optical system, with respect to each of a plurality of positions on the surface arranged along a direction of a scan of the wafer, while the scan is performed;
   moving the wafer based on positions of the surface detected in said detecting step, while the exposure is performed;
   exposing the wafer, moved in said moving step, to light via the mask and the projection optical system;
   calculating a difference, the difference being a difference between two detected positions of a plurality of detected positions of the surface, the plurality of detected positions of the surface being obtained in said detecting step, while the scan is performed, without performing the exposure, the two detected positions being obtained with respect to two successive positions of the plurality of positions on the surface;
   comparing the difference with a threshold; and
   performing an indication concerning a comparison performed in said comparing step.

* * * * *

UNITED STATES PATENT AND TRADEMARK OFFICE
CERTIFICATE OF CORRECTION

PATENT NO.         : 7,339,662 B2
APPLICATION NO. : 11/114158
DATED                  : March 4, 2008
INVENTOR(S)        : Hiroaki Takeishi It is certified that error appears in the above-identified patent and that said Letters Patent is hereby corrected as shown below:

ON THE COVER PAGE:
In item "(56) References Cited," under "FOREIGN PATENT DOCUMENTS," in the second column on the second page, the first-listed document:

"JP            63006511  A  *  1/1988"

should read -- JP        63-6511        A  *    1/1998 --.

In item "(57) ABSTRACT," line 5, "respect" should read -- respect to --.

COLUMN 2:
Line 41, "respect" should read -- respect to --.
Line 61, "respect" should read -- respect to --.

COLUMN 3:
Line 28, "apparatus/comprises" should read -- apparatus comprises --.

COLUMN 6:
Line 3, "system," should read -- system --.
Line 4, "performed," should read -- performed --.
Line 55, "step," should read -- step -- and "performed," should read -- performed --.

Signed and Sealed this

Twenty-first Day of October, 2008

JON W. DUDAS
*Director of the United States Patent and Trademark Office*